(12) United States Patent
Naura et al.

(10) Patent No.: US 7,460,401 B2
(45) Date of Patent: Dec. 2, 2008

(54) METHOD FOR CHECKING BLOCK ERASING OF A MEMORY AND CIRCUIT THEREOF

(75) Inventors: David Naura, Aix en Provence (FR); Christophe Moreaux, Simiane (FR); Ahmed Kari, Aix en Provence (FR); Pierre Rizzo, Aix en Provence (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/468,257

(22) Filed: Aug. 29, 2006

(65) Prior Publication Data
US 2007/0053233 A1 Mar. 8, 2007

(30) Foreign Application Priority Data
Sep. 8, 2005 (FR) .................................. 05 09142

(51) Int. Cl.
*G11C 16/34* (2006.01)
(52) U.S. Cl. ..................... 365/185.12; 365/185.11; 365/185.22; 365/185.23
(58) Field of Classification Search ............ 365/185.12, 365/185.11, 185.22, 185.23, 185.24
See application file for complete search history.

(56) References Cited

U.S. PATENT DOCUMENTS

| | | | | |
|---|---|---|---|---|
| 5,297,096 A * | 3/1994 | Terada et al. | ........... | 365/185.11 |
| 5,363,330 A * | 11/1994 | Kobayashi et al. | ..... | 365/185.11 |
| 5,526,309 A | 6/1996 | Jinbo | ..................... | 365/185.29 |
| 5,646,891 A * | 7/1997 | Okamoto | ............... | 365/185.22 |
| 6,198,663 B1 | 3/2001 | Takizawa | ............... | 365/185.29 |
| 6,377,488 B1 * | 4/2002 | Kim et al. | .............. | 365/185.22 |
| 6,412,086 B1 | 6/2002 | Friedman et al. | ............ | 714/733 |
| 6,714,450 B2 * | 3/2004 | Bertrand et al. | ........ | 365/185.08 |
| 6,967,892 B2 * | 11/2005 | Tanaka et al. | .......... | 365/230.06 |
| 7,058,754 B2 * | 6/2006 | Frayer | ........................ | 711/102 |
| 2002/0163832 A1 | 11/2002 | Bertrand et al. | ........ | 365/185.08 |
| 2004/0174747 A1 | 9/2004 | Tanaka et al. | .......... | 365/185.22 |

\* cited by examiner

*Primary Examiner*—Andrew Q Tran
(74) *Attorney, Agent, or Firm*—Lisa K. Jorgenson; Dennis M. de Guzman; Seed IP Law Group PLLC

(57) ABSTRACT

A method checks the state of a set of memory cells of a memory having memory cells arranged in a memory array, row and column decoders for selecting a memory cell, and a sense amplifier for supplying a state of the selected memory cell depending on whether the selected memory cell is conductive or non-conductive. The method includes features wherein all the memory cells of a set grouping together several memory cells are selected, and then simultaneously coupled to the sense amplifier, and the sense amplifier supplies a global state of all the selected memory cells to which it is coupled, if the latter are simultaneously non-conductive. Application is provided to the checking of a command for block-erasing a memory.

23 Claims, 3 Drawing Sheets

METHOD FOR CHECKING BLOCK ERASING OF A MEMORY AND CIRCUIT THEREOF

TECHNICAL FIELD

The present disclosure generally relates to memories in which each memory cell has a programmed or erased state depending on whether the memory cell is conductive or not.

The present disclosure relates more particularly but not exclusively to an erasable and programmable memory, comprising memory cells arranged in a memory array, selection means for selecting a memory cell, and a sense amplifier to supply the state of the selected memory cell.

BACKGROUND INFORMATION

In particular, in an EEPROM memory, the memory cells are arranged according to word lines and according to bit columns transverse to the word lines. The memory cells of a bit column are coupled to a common bit line. The memory further comprises a line decoder to select a word line, a column decoder to select a bit line, and selection transistors controlled by the column decoder to couple the sense amplifier to a selected bit line.

Each memory cell comprises a floating-gate transistor coupled in series with a MOS-type access transistor. The floating-gate transistor comprises a floating gate and a control gate CG formed on the floating gate.

All the memory cells of a block, grouping together all or part of the memory cells of the memory, can be erased simultaneously by putting the control gate of all the floating-gate transistors of the block to a certain potential. The checking of this operation involves reading all the memory cells of the erased block.

Now, a memory cell is read by selecting the memory cell and by coupling it to a sense amplifier. As the memory only comprises a limited number of sense amplifiers, this checking operation requires a number of read cycles at least equal to the number of memory cells to be checked, divided by the number of sense amplifiers. Moreover, if all the erased memory cells are coupled to a same bit line, only one sense amplifier can be used. As a result, the number of read cycles required to check each of the erased memory cells is equal to the number of memory cells to be checked.

When the number of memory cells erased simultaneously is high, it is often not possible to check such an erasing operation.

BRIEF SUMMARY OF THE INVENTION

An embodiment of the present invention aims to check the erased state of a block of memory cells in one read cycle.

An embodiment provides a method for checking the state of a set of memory cells of a memory comprising memory cells arranged in a memory array, selection means for selecting a memory cell, and a sense amplifier for supplying a state of the selected memory cell depending on whether the selected memory cell is conductive or non-conductive.

According to one embodiment of the present invention, the method comprises:
 selecting all the memory cells of a set grouping together several memory cells,
 coupling the sense amplifier simultaneously to all the selected memory cells, and
 supplying by the sense amplifier a global state of all the selected memory cells to which it is coupled, if the latter are all simultaneously non-conductive. According to one embodiment of the present invention, the memory cells are arranged in the memory array according to word lines and according to bit columns transverse to the word lines, the memory cells of a bit column being coupled to a common bit line, the method comprising:
 simultaneously selecting several word lines,
 selecting a bit line, and
 coupling the sense amplifier to the selected bit line, so as to simultaneously couple the sense amplifier to all the memory cells coupled to the bit line selected and belonging to the selected word lines.

According to one embodiment of the present invention, the memory cells are arranged in the memory array according to word lines and according to bit columns transverse to the word lines, the memory cells of a bit column being coupled to a common bit line, the method comprising:
 selecting at least one word line,
 selecting several bit lines, and
 coupling the sense amplifier to the selected bit lines, so as to simultaneously couple it to all the memory cells coupled to the bit lines selected and belonging to the selected word lines.

According to one embodiment of the present invention, the memory cells are arranged in the memory array according to word lines and according to bit columns transverse to the word lines, the memory cells of a bit column being coupled to a common bit line, the bit lines being grouped together into word columns comprising m bit lines, m being a whole number greater than 1, the memory comprising m sense amplifiers, the method comprising:
 selecting several word lines,
 selecting all the bit lines of a word column, and
 coupling each sense amplifier to a selected bit line, such that each sense amplifier is coupled to the memory cells coupled to the bit line and belonging to the selected word lines.

According to one embodiment of the present invention, the memory cells are arranged in the memory array according to word lines and according to bit columns transverse to the word lines, the memory cells of a bit column being coupled to a common bit line, the bit lines being grouped together into word columns comprising m bit lines, m being a whole number greater than 1, the memory comprising m sense amplifiers, the method comprising:
 selecting at least one word line,
 selecting all the bit lines of several selected word columns, and
 coupling each sense amplifier to a bit line of each selected word column, such that each sense amplifier is coupled to the memory cells coupled to several bit lines and belonging to the selected word lines.

According to one embodiment of the present invention, all the memory cells of the memory are selected and coupled simultaneously to a sense amplifier.

An embodiment of the present invention also relates to a method for erasing a block of memory cells of a memory comprising a memory array in which memory cells are arranged, and at least one sense amplifier for reading a selected memory cell, the method comprising:
 selecting the memory cells to be erased, and
 erasing the selected memory cells by putting them into the non-conductive state.

According to an embodiment of the present invention, the erasing method further comprises checking the state of the erased memory cells in accordance with the checking method as defined above.

An embodiment of the present invention also relates to a memory comprising:

memory cells arranged in a memory array, selection means for selecting memory cells, a sense amplifier for determining whether a selected memory cell to which it is coupled is conductive or non-conductive, and switch means for coupling a selected memory cell to the sense amplifier.

According to an embodiment of the present invention, the selection and switch means enable several memory cells to be selected simultaneously and coupled to the sense amplifier, the sense amplifier supplying a global state of all the selected memory cells to which it is coupled, if the latter are all simultaneously non-conductive.

According to one embodiment of the present invention, the memory cells are arranged in the memory array according to word lines and according to bit columns transverse to the word lines, the memory cells of a bit column being coupled to a common bit line, the memory comprising:

a line decoder for selecting one or simultaneously several word lines, a column decoder for selecting a bit line, and switch means controlled by the column decoder to couple the sense amplifier to a selected bit line.

According to one embodiment of the present invention, the memory cells are arranged in the memory array according to word lines and according to bit columns transverse to the word lines, the memory cells of a bit column being coupled to a common bit line, the memory comprising:

a line decoder for selecting one or simultaneously several word lines, a column decoder for selecting one or simultaneously several bit lines, and switch means controlled by the column decoder to couple the sense amplifier to any selected bit lines.

According to one embodiment of the present invention, the memory cells are arranged in the memory array according to word lines and according to bit columns transverse to the word lines, the memory cells of a bit column being coupled to a common bit line, the bit columns being grouped together into word columns comprising m+1 bit lines, m being a whole number greater than 0, the memory comprising:

a line decoder for simultaneously selecting several word lines, a column decoder for selecting a word column, m+1 sense amplifiers, and a selection transistor for each bit line of a word column, each transistor being controlled by the column decoder so as to couple each sense amplifier to a bit line of the selected word column.

According to one embodiment of the present invention, the memory cells are arranged in the memory array according to word lines and according to bit columns transverse to the word lines, the memory cells of a bit column being coupled to a common bit line, the bit columns being grouped together into word columns comprising m+1 bit lines, m being a whole number greater than 0, the memory comprising:

a line decoder for selecting one or simultaneously several word lines, a column decoder for simultaneously selecting several word columns, m+1 sense amplifiers, and a selection transistor for each bit line of a word column, each transistor being controlled by the column decoder so as to couple each sense amplifier to a bit line of each selected word column.

According to one embodiment of the present invention, all the memory cells of the memory are selected and coupled simultaneously to a sense amplifier.

According to one embodiment of the present invention, each memory cell comprises a floating-gate transistor arranged in series with an access transistor the gate of which is coupled to a selection line common to the memory cells belonging to a same word line, and the drain of which is coupled to a bit line common to the memory cells belonging to a same bit line, the selection lines being coupled to the line decoder.

According to one embodiment of the present invention, the memory is electrically erasable and programmable.

One embodiment of the present invention also relates to an integrated circuit comprising a microprocessor, and a memory as defined above, the microprocessor comprising means for controlling the selection, erasing and erase check of several memory cells of the memory simultaneously.

According to one embodiment of the present invention, the integrated circuit is an RFID tag.

BRIEF DESCRIPTION OF THE SEVERAL VIEWS OF THE DRAWINGS

These and other features of the present invention will be explained in greater detail in the following description of one or more embodiments of the present invention given in relation with, but not limited to, the following figures, in which.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
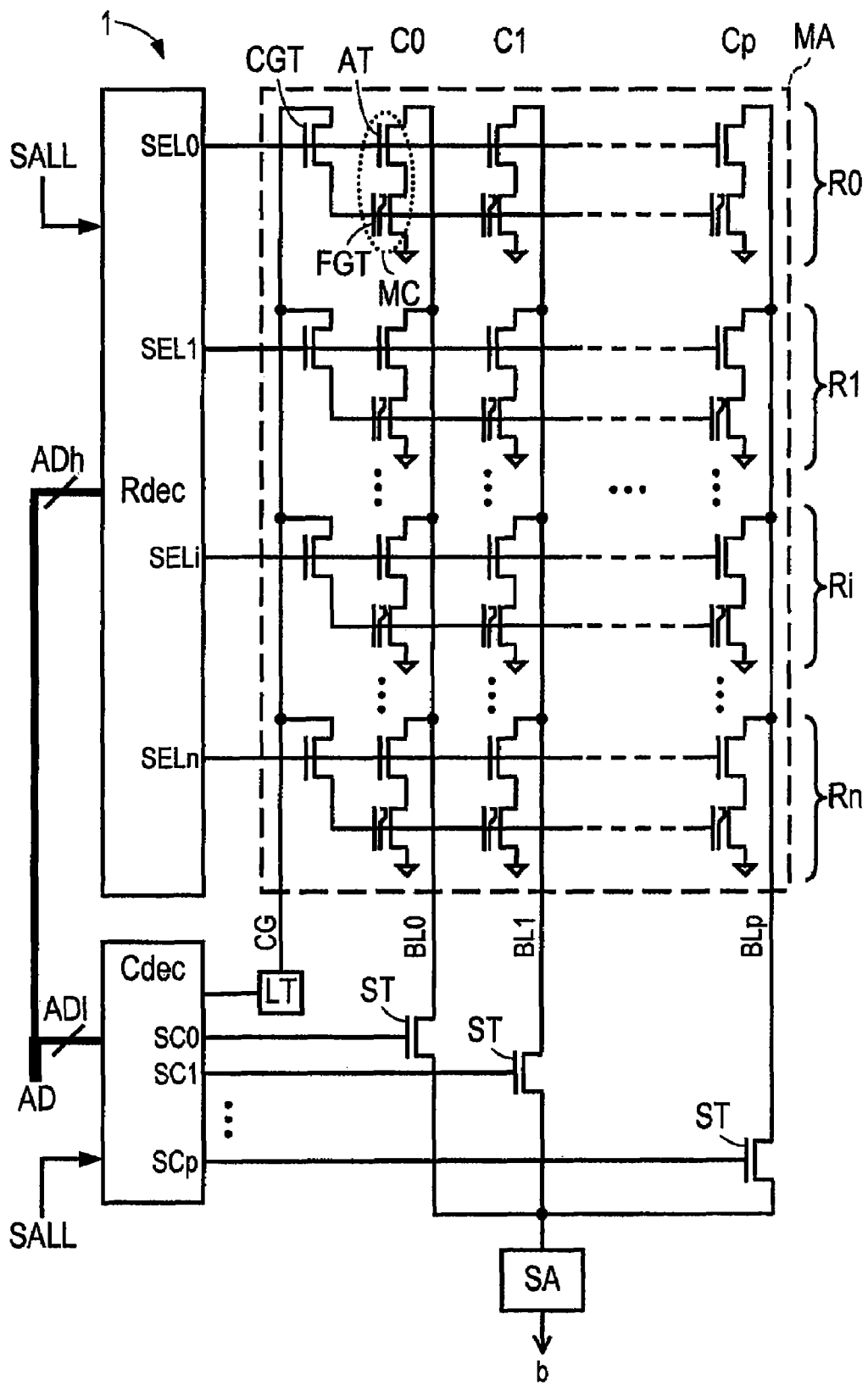
FIG. 1 represents one example architecture of an EEPROM memory with a single sense amplifier, in which the erased state of a block of memory cells can be checked according to an embodiment of the present invention.

FIG. 1 represents one example of an EEPROM memory 1 comprising a memory array MA in which memory cells MC are arranged, a line decoder RDEC, a column decoder CDEC and a sense amplifier SA. The memory 1 of one embodiment can therefore store binary words each bit of which that is stored by a memory cell can be read sequentially. In another embodiment, the memory 1 can store binary words such that each bit can be read individually. Such a memories are, for example, used in RFID tags.

In some embodiments, the memory cells MC are arranged in the memory array in word lines Ri, i being a whole number between 0 and n, each bit column comprising n+1 memory cells. The memory cells are also arranged in bit columns Ck transverse to the word lines, k being a whole number between 0 and p, each word line comprising p+1 memory cells.

Each word line Ri comprises a selection line SELi coupled to the line decoder RDEC and to the memory cells of the word line. Each word line further comprises a control gate transistor CGT the gate of which is controlled by the selection line SELi. Each bit column Ck comprises a bit line BLk coupled to the memory cells MC of the bit column. In some embodiments, a control gate line CG links the drain of the control gate transistors CGT to the output of a latch LT controlled by the column decoder CDEC. Each bit line is coupled to the drain of a selection transistor ST the gate of which is controlled by the column decoder. The gate of the selection transistor ST of each bit column is coupled to the column decoder through a column selection line SCk. In some embodiments, the sources of the transistors ST are coupled to the input of the sense amplifier SA.

In some embodiments, the line decoder RDEC receives at input the most significant bits ADh of an address AD of the memory, while the column decoder CDEC receives the least significant bits ADl of the address AD.

In some embodiments, each memory cell MC comprises an access transistor AT mounted in series with a floating-gate transistor FGT. The source of the transistor FGT is coupled to the ground. The gate of the transistor AT is coupled to the selection line SELi of the word line Ri to which the memory cell belongs. The gate of the transistors FGT of a word line Ri is coupled to the source of the transistor CGT common to the memory cells of the word line. The drain of the transistor AT is coupled to the bit line BLk of the bit column Ck.

The operation of such a memory cell embodiment is based on the tunnel effect (or Fowler-Nordheim effect) and involves inducing displacements of the threshold voltage of the floating-gate transistor FGT by injecting or withdrawing charges from its floating gate through a thin oxide layer separating the floating gate from the doped silicon zone forming the transistor. In some embodiments, an operation of erasing or programming a memory cell involves injecting or extracting electric charges by Fowler-Nordheim effect in the floating gate of the transistor FGT. The transistor FGT has a threshold voltage VT1 (for example equal to approximately −2 V) in the programmed state, and a threshold voltage VT2 (for example equal to approximately 4 V) in the erased state greater than the voltage VT1. When a read voltage Vread between VT1 and VT2 is applied through the transistor CGT, to the control gate of the transistor FGT, the latter remains OFF if it is erased, which corresponds by convention to a logic "0", and is ON if it is programmed, which corresponds to a logic "1". It will be understood that in some embodiments, another convention (such as a reverse convention) can be chosen.

In some embodiments, a memory cell belonging to the word line Ri and to the bit column Ck is selected by applying predefined voltages to the selection line SELi of the word line Ri, and to the column selection line SCk of the bit column Ck. The latch LT is controlled to unblock the transistor CGT of a word line Ri. During reading, one effect of selecting a bit column Ck is particularly to unblock the transistor ST and thus to couple to the sense amplifier SA the bit line BLk coupled to the selected memory cell. The output of the sense amplifier SA supplies a binary signal b representative of the conductive or non-conductive state of the memory cell MC selected.

According to some embodiments of the present invention, the line RDEC and column CDEC decoders enable several memory cells to be read-selected, and all of the selected memory cells MC to be simultaneously coupled to the sense amplifier SA. If all the memory cells coupled to the sense amplifier are non-conductive (erased), the sense amplifier detects a non-conductive state (erased) and thus supplies a logic "0". In some embodiments, this signal is representative of the erased state of all the selected memory cells. On the other hand, if one or more of the selected memory cells are conductive (programmed), the sense amplifier supplies a logic "1". The output signal b of the sense amplifier SA thus indicates whether a previous operation of erasing a set of memory cells was successful or failed. However, if the signal b is "1", it does not enable those selected memory cells that are erased and those that are programmed to be determined.

The memory cells coupled to the sense amplifier SA can be selected in different ways. Thus, in some embodiments, all the word lines Ri or only some of them can be selected, while only one bit line BLk is coupled to the sense amplifier. In other embodiments, all the bit lines or only some of them can be coupled to the sense amplifier, while one or more word lines are selected.

According to one embodiment of the present invention, the line RDEC and column CDEC decoders each comprise a control input SALL for read-selecting all the memory cells of the memory 1. Thus, all the memory cells of the memory can be erased and then read-selected to check the erasing.

Figure 2:
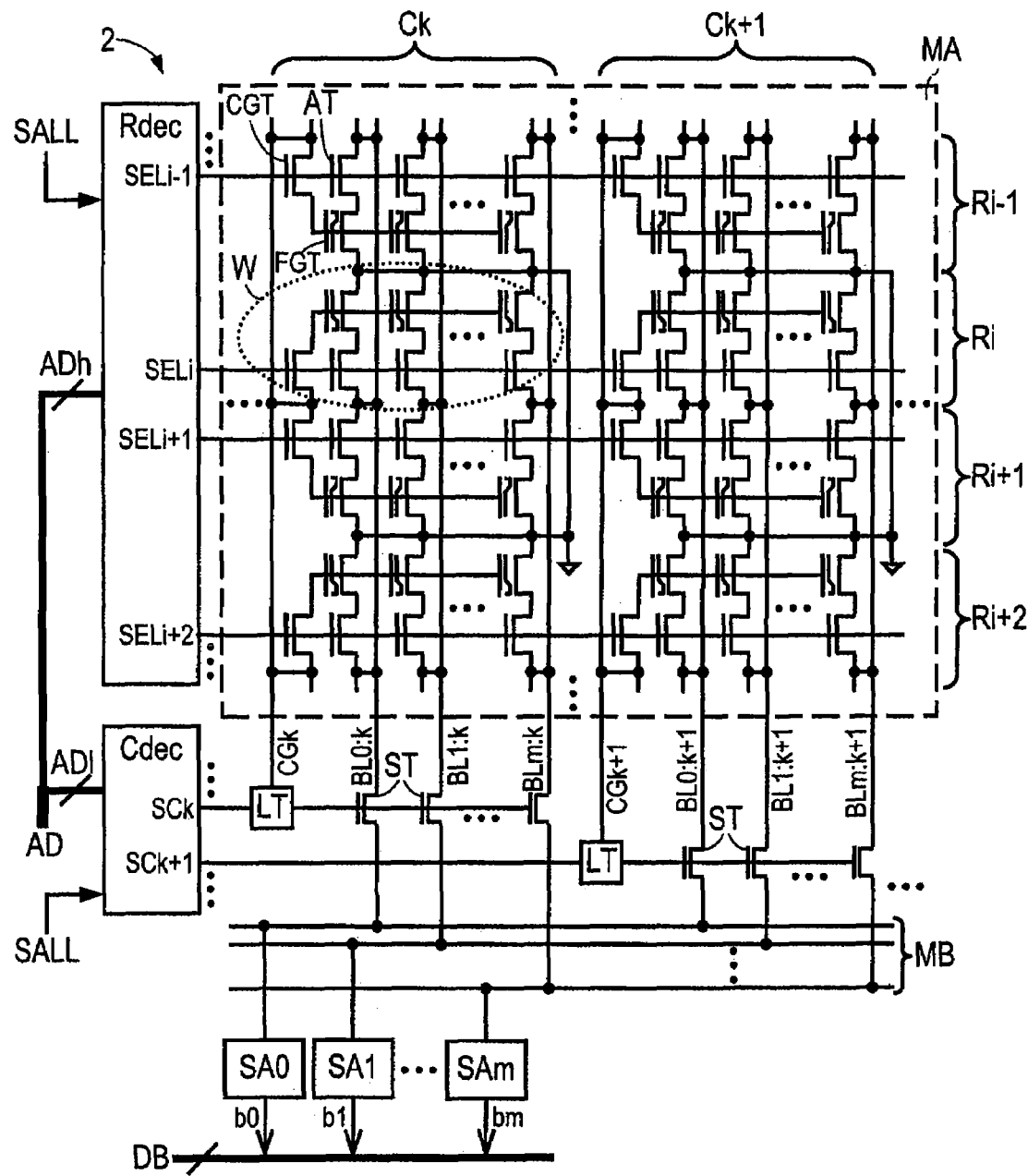
FIG. 2 represents one example architecture of an EEPROM memory with several sense amplifiers, in which the erased state of a block of memory cells can be checked according to one embodiment of the present invention.

FIG. 2 represents an example of an EEPROM memory 2 with m+1 sense amplifiers SA0-SAm (m being a whole number greater than 0), to simultaneously read all the bits of a binary word with m+1 bits stored in the memory. As in FIG. 1, some embodiments of the memory 2 comprise a memory array MA in which the memory cells MC are arranged in word lines Ri and in bit columns transverse to the word lines each further comprising a bit line BLj:k coupled to the memory cells of the bit column (j being a whole number between 0 and m). The bit columns are grouped together into word columns comprising m+1 bit columns. Each intersection of a word line Ri and of a word column Ck thus defines a group W of m+1 memory cells forming a word.

In some embodiments, each word line Ri comprises a selection line SELi coupled to the line decoder RDEC and to the memory cells of the word line. Each word column Ck comprises a control gate line CGk coupled to the drain of control gate transistors CGT, each transistor CGT being common to the memory cells MC of a group W. Each control gate line is coupled to a latch LT common to each word column, and controlled by the column decoder CDEC.

In some embodiments, each bit line BLj:k is coupled to the drain of a selection transistor ST, the gate of which is controlled by the column decoder CDEC. The latch LT and the selection transistors ST of each word column Ck are coupled to the column decoder CDEC through a column selection line SCk. The source of each of the transistors ST is coupled to the input of a sense amplifier SAj through a multiplexing bus MB, and the drain of each of the transistors ST is coupled to the bit line BLj:k.

In some embodiments, the line decoder RDEC receives at input the most significant bits ADh of an address AD of the memory, while the column decoder CDEC receives the least significant bits ADl of the address AD.

In some embodiments, each memory cell MC comprises an access transistor AT mounted in series with a floating-gate transistor FGT. The source of the transistor FGT is coupled to the ground. In a group of memory cells forming a word W, i.e., belonging to a same word line Ri and a same word column Ck, the gate of the transistors FGT is coupled to the source of the transistor CGT common to the memory cells of the word W. The gates of the transistors AT and CGT of a word line Ri are coupled to the word line selection line SELi.

In some embodiments, a group W of memory cells belonging to a word line Ri and a word column Ck is selected by applying predefined voltages to the selection line SELi of the word line Ri, and to the selection line SCk of the word column Ck, to control the latches LT and the selection transistors ST of this word column. During reading, the effect of selecting a word column Ck is to couple to a sense amplifier SAj each bit line BLj:k of the word column Ck to which the selected memory cells belong. Each sense amplifier SAj applies to a bus DB a binary signal bj representative of the conductive or non-conductive state of a selected memory cell MC to which it is coupled.

According to some embodiments of the present invention, the line RDEC and column CDEC decoders enable several groups W of memory cells to be read-selected, and all the groups W of selected memory cells to be simultaneously coupled to the sense amplifiers SAj. As described in some embodiments above with reference to FIG. 1, each sense amplifier is thus coupled simultaneously to several selected memory cells. All the word lines Ri or only some of them can be selected, while only one word column Ck is selected. The result is that each bit line BLj:k of the selected word column is coupled to a sense amplifier SAj. In some alternate embodiments, all the bit lines or only some of them can be coupled to a sense amplifier, while one or more word lines are selected.

As described above in some embodiments with reference to FIG. 1, the line RDEC and column CDEC decoders can advantageously each comprise a control input SALL for read-selecting all the memory cells of the memory 2. Thus, the execution of an erase command for erasing all the memory cells of the memory can be checked.

Figure 3:
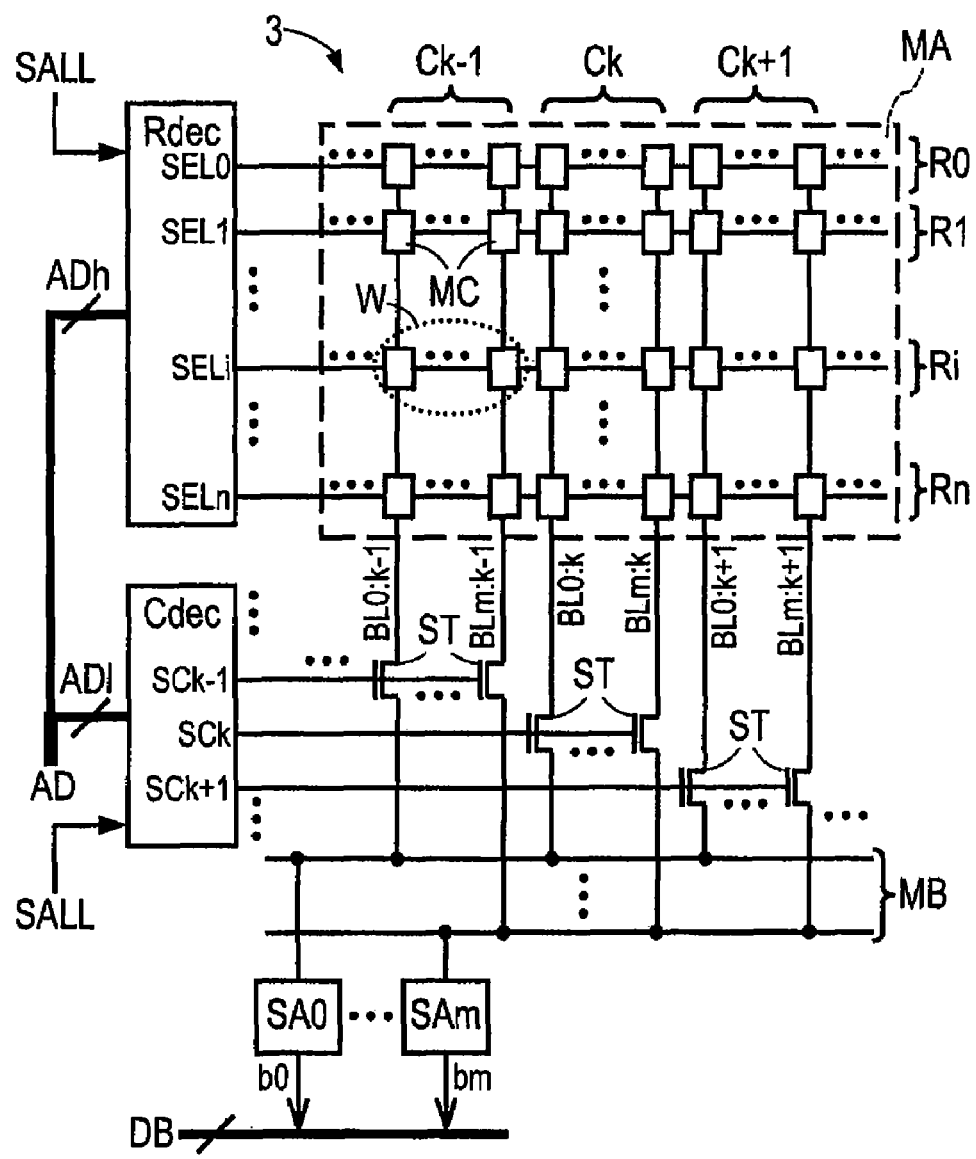
FIG. 3 represents one example architecture of a memory with several sense amplifiers, in which the erased state of a block of memory cells can be checked according to one embodiment of the present invention.

It will be understood by those skilled in the art that various embodiments of the memory according to the present invention may be made. Thus, as shown in FIG. 3, an embodiment of the present invention does not necessarily apply to an EEPROM memory, but to any memory in which the memory cells are ON or OFF according to their programmed or erased state. The embodiment of memory 3 represented in FIG. 3 comprises a memory array MA in which the memory cells MC are arranged in word lines Ri and in bit columns transverse to the word lines each comprising a bit line BLj:k coupled to the memory cells of the bit column. The bit columns are grouped together into word columns Ck comprising 1 to m+1 bit columns, m+1 being the number of sense amplifiers SA0-SAm of the memory.

In some embodiments, each word line Ri comprises a selection line SELi coupled to the line decoder RDEC and to the memory cells of the word line. Each bit line BLj:k is coupled to the drain of a selection transistor ST, the gate of which is controlled by the column decoder CDEC. The gate of the selection transistor ST of each word column Ck is coupled to the column decoder CDEC through a column selection line SCk. The source of each of the transistors ST is coupled to the input of a sense amplifier SAj (j being a whole number between 0 and m) through a multiplexing bus MB, and the drain of each of the transistors ST is coupled to the bit line BLj:k.

In some embodiments, the line decoder RDEC receives at input the most significant bits ADh of an address AD of the memory, while the column decoder CDEC receives the least significant bits ADl of the address AD.

In some embodiments, a group W of memory cells belonging to a word line Ri and a word column Ck in the memory 3 is selected by applying predefined voltages to the selection line SELi of the word line Ri, and to the selection line SCk of the word column Ck, to control the selection transistors ST of this word column. During reading, the effect of selecting a word column Ck is to couple each bit line BLj:k of the selected word column Ck to a sense amplifier SAj. Each sense amplifier SAj supplies on a bus DB a binary signal bj representative of the conductive or non-conductive state of a memory cell MC of the group of selected memory cells to which it is coupled.

According to some embodiments of the present invention, the line RDEC and column CDEC decoders enable several groups W of memory cells to be read-selected, and all the groups W of selected memory cells to be simultaneously coupled to the sense amplifiers SA0-SAm. As described above with reference to FIG. 2, each sense amplifier is thus coupled simultaneously to several selected memory cells. All the word lines Ri or only some of them can be selected, while only one word column Ck is selected, i.e., each bit line BLj:k of the selected word column Ck is coupled to a sense amplifier SA0-SAm. In some other embodiments, all the bit lines or only some of them can be coupled to a sense amplifier, while one or more word lines are selected.

In some embodiments, the line RDEC and column CDEC decoders can also each comprise a control input SALL to select all the memory cells of the memory 3, so as to execute an erase command for erasing the entire memory, and to check the execution thereof.

Furthermore, it is not necessary for the memory cells of the memory to be spread out in accordance with a matrix structure in lines and columns. It is sufficient that the memory comprises one or more sense amplifiers and that each sense amplifier can be simultaneously coupled to several selected memory cells.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for checking a state of a set of memory cells of a memory including memory cells arranged in a memory array according to word lines and according to bit columns transverse to the word lines, row and column decoders for selecting a memory cell, and a sense amplifier for supplying a unique signal representative of a conductive or non-conductive state of one the memory cells, the memory cells of a bit column being coupled to a common bit line, each memory cell having a floating-gate transistor and an access transistor coupled to the floating-gate transistor, the method comprising:

selecting at least one word line;

selecting several bit lines so that all of the memory cells, each having the floating-gate transistor and the access transistor coupled to the floating-gate transistor, coupled to the selected bit lines and belonging to the selected word lines are selected;

coupling the sense amplifier simultaneously to all of the selected bit lines; and supplying by the sense amplifier a global state of all of the memory cells coupled to said selected bit lines to which the sense amplifier is coupled, if the memory cells coupled to said selected bit lines are all simultaneously in said non-conductive state.

2. The method according to claim 1 wherein said selecting at least one word line includes:

simultaneously selecting several word lines.

3. The method according to claim 1 wherein the bit lines are grouped together into word columns including m bit lines, m being an integer number greater than 1, the memory having m sense amplifiers, the method comprising:

selecting all the bit lines of several selected word columns; and coupling each sense amplifier to a bit line of each selected word column, such that each sense amplifier is coupled to the memory cells coupled to several bit lines and belonging to selected word lines.

4. The method according to claim 1 wherein all of the bit lines of the memory are selected and coupled simultaneously to the sense amplifier.

5. A method for erasing a block of memory cells of a memory including a memory array in which memory cells are arranged according to word lines and according to bit columns transverse to the word lines, and a sense amplifier for supplying a unique signal representative of a conductive or non-conductive state of one of the memory cells, the memory cells of a bit column being coupled to a common bit line, each memory cell having a floating-gate transistor and an access transistor coupled to the floating-gate transistor, the method comprising:

selecting memory cells, each having the floating-gate transistor and the access transistor coupled to the floating-gate transistor, to be erased by selecting a word line and several bit lines coupled to said memory cells to be erased;

erasing the selected memory cells by putting them into the non-conductive state; and checking a state of the erased memory cells by:

coupling the sense amplifier simultaneously to all of the selected bit lines; and supplying by the sense amplifier a global state of all of the memory cells coupled to said selected bit lines to which the sense amplifier is coupled, if the memory cells coupled to said selected bit lines are all simultaneously in said non-conductive state.

6. The method of claim 5 said selecting the word line includes simultaneously selecting several word lines.

7. The method of claim 5 wherein the bit lines are grouped together into word columns including m bit lines, m being an integer number greater than 1, the memory having m sense amplifiers, the method comprising:

selecting all the bit lines of several selected word columns; and coupling each sense amplifier to a bit line of each selected word column, such that each sense amplifier is coupled to the memory cells coupled to several bit lines and belonging to selected word lines.

8. The method claim 5 wherein all of the bit lines of the memory are selected and coupled simultaneously to the sense amplifier.

9. A memory, comprising:

memory cells arranged in a memory array according to word lines and according to bit columns transverse to the word lines, the memory cells of a bit column being coupled to a common bit line, each memory cell having a floating-gate transistor and an access transistor coupled to the floating-gate transistor;

selection means for selecting at least one word line and at least one bit line;

a sense amplifier to supply a unique signal representative of a conductive or non-conductive state of a memory cell belonging to a selected bit line to which the sense amplifier is coupled; and switch means for coupling the selected bit line to the sense amplifier, wherein the selection and switch means are respectively adapted to select simultaneously several bit lines and to couple the sense amplifier simultaneously to the selected bit lines, the sense amplifier being adapted to supply a global state of all of the memory cells belonging to the selected bit lines to which the sense amplifier is coupled, if the memory cells coupled to said selected bit lines are all simultaneously in said non-conductive state.

10. The memory according to claim 9 wherein said selection means includes:

a line decoder adapted to select simultaneously several word lines.

11. The memory according to claim 9 wherein the bit columns are grouped together into word columns, each word column including m bit lines, m being an integer number greater than 1, wherein said selection means includes a column decoder to simultaneously select several word columns, the memory further comprising:

m sense amplifiers; and a selection transistor for each bit line of a word column, each selection transistor being controlled by the column decoder so as to couple each sense amplifier to a bit line of each selected word column.

12. The memory according to claim 9 wherein all the bit lines of the memory are selected and simultaneously coupled to the sense amplifier.

13. The memory according to claim 9 wherein for each memory cell, the floating-gate transistor is coupled in series with the access transistor, a gate of which is coupled to a selection line common to the memory cells belonging to a same word line, and a drain of which is coupled to the bit line common to the memory cells belonging to a same bit column, plural ones of the selection line being coupled to a line decoder.

14. The memory of claim 9 wherein the memory comprises an electrically erasable and programmable memory of an RFID tag.

15. An integrated circuit comprising a microprocessor, and a memory according to claim 9, the microprocessor including means for controlling selection, erase, and erase check of several memory cells of the memory simultaneously.

16. The integrated circuit according to claim 15 wherein the integrated circuit is part of an RFID tag.

17. A method for checking a state of a group of memory cells arranged in a memory array arranged according to word lines and according to bit columns transverse to the word lines, the method comprising:
- grouping together a plurality of memory cells into a set, each memory cell having a floating-gate transistor and an access transistor coupled to the floating-gate transistor;
- selecting the set by selecting at least one word line and several bit lines in the set;
- coupling a sense amplifier simultaneously to the selected bit lines in the set;
- supplying by the sense amplifier a global state of the memory cells in the set that are coupled to the selected bit lines to which the sense amplifier is coupled, if each memory cell in the set is simultaneously non-conductive; and
- checking the global state.

18. The method according to claim 17 wherein said selecting at least one word line includes:
- simultaneously selecting a plurality of word lines.

19. The method according to claim 18 wherein all of the bit lines in the memory array are selected and coupled simultaneously to the sense amplifier.

20. A memory, comprising:
- memory cells arranged in a memory array according to word lines and according to bit columns transverse to the word lines, each memory cell having a floating-gate transistor and an access transistor coupled to the floating-gate transistor;
- means for grouping together a plurality of memory cells into a set;
- means for selecting the set by selecting at least one word line and several bit lines in the set;
- sense amplifier means for supplying a unique signal representative of a conductive or non-conductive state of a memory cell belonging to a selected bit line in the set to which the sense amplifier means is coupled; and
- means for selectively coupling the sense amplifier means to the selected bit line in the set so as to supply a global state of the memory cells belonging to the selected bit line in the set, if each memory cell belonging to the selected bit line in the set is simultaneously in said non-conductive state.

21. The memory according to claim 20 wherein said means for selecting includes:
- a line decoder to select simultaneously several word lines.

22. The memory according to claim 20 wherein the bit columns are grouped together into a plurality of word columns, each word column including m common bit lines, m being an integer number greater than 1, wherein said means for selecting includes a column decoder to simultaneously select several word columns, wherein the sense amplifier means includes m sense amplifiers, the memory further comprising:
- a selection transistor for each common bit line of each word column, each selection transistor being controlled by the column decoder so as to couple each sense amplifier to one common bit line of the selected word columns.

23. The memory according to claim 22 wherein the bit lines of the memory are all selected and simultaneously coupled to each respective one of said sense amplifiers.

* * * * *